United States Patent [19]
Meitner et al.

[11] Patent Number: 4,547,819
[45] Date of Patent: Oct. 15, 1985

[54] MAGNETIC PICKUP PREAMPLIFIER

[75] Inventors: Edmund M. Meitner, Cote St. Luc; Howard Burman, Montreal, both of Canada

[73] Assignee: Amber Electro Design, Inc., Montreal, Canada

[21] Appl. No.: 491,349

[22] Filed: May 4, 1983

[51] Int. Cl.$^4$ .......................... G11B 5/45; G11B 5/02
[52] U.S. Cl. ........................................ 360/65; 360/67
[58] Field of Search ............... 360/65, 67; 369/128; 330/260, 290

[56] References Cited

U.S. PATENT DOCUMENTS

| | | | |
|---|---|---|---|
| 4,093,965 | 6/1978 | Gish | 360/65 |
| 4,255,769 | 3/1981 | Naylor et al. | 360/65 |
| 4,293,823 | 10/1981 | Hockberg et al. | 360/67 |
| 4,386,378 | 5/1983 | Guisinger | 360/67 |

OTHER PUBLICATIONS

Netzer, Y., "The Design of Low-Noise Amplifiers," Proceedings of the IEEE, vol. 69, No. 6, pp. 739-740, Jun. 1981.

Primary Examiner—Vincent P. Canney
Attorney, Agent, or Firm—Leonard Bloom

[57] ABSTRACT

A magnetic pickup which contains both resistance and stray capacitance is terminated by a negative impedance of a kind which compensates for the stray capacitance and part of the resistance, and causes a pole to be produced at a low frequency. This results in the formation of a virtually perfect integrator. Preferably the integrator is followed by a pedestal filter for receiving the output signal of the integrator, and has a zero phase shift point at a predetermined frequency higher than the frequency of the pole and within the frequency band, and has an intermediate frequency band transfer characteristic which increases at a rate of approximately equal to the decrease in transfer characteristic of integrator.

6 Claims, 3 Drawing Figures

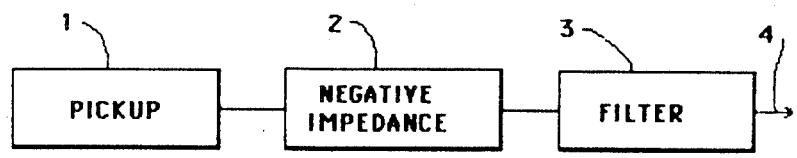
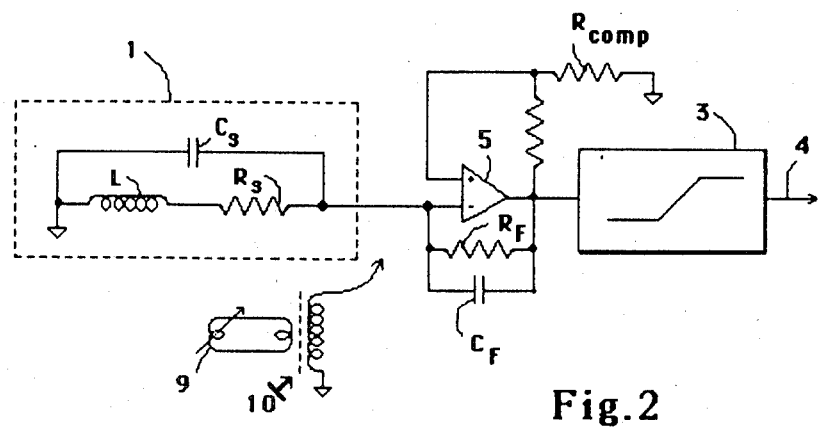
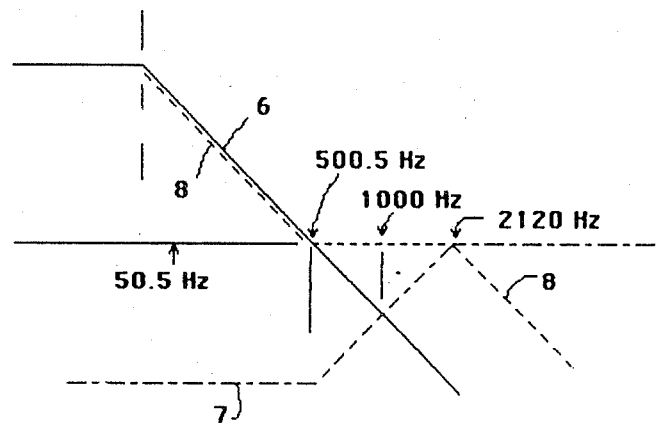

MAGNETIC PICKUP PREAMPLIFIER

This invention relates to an equalizing preamplifier for use in conjunction with magnetic pickups such as phonograph cartridges or magnetic tape heads.

The equivalent circuit of a typical magnetic pickup is comprised of an inductor in series with a resistor, the combination providing its characteristic terminal impedance. In addition, the series circuit is bypassed by stray capacitance. Due to the inductor and capacitor in parallel, a resonant peak often occurs at between approximately 30 kHz and 40 kHz. It has been difficult to obtain ultimately high quality reproduction of sound from a magnetic pickup due to this pickup resonance.

Pickup manufacturers have attempted to design the pickup to place the resonance point outside the audio band. Yet in order to minimize transient distortion, it is necessary for the pickup to exhibit a very wide frequency response and very low or no phase distortion.

In addition, it is desirable to provide an output signal which follows a predetermined standard frequency response characteristic, such as RIAA or NAB.

Designers of prior art preamplifiers which include equalizers have treated the magnetic pickup as an ideal inductive element, assuming that mechanical constraints and stray capacitance would be minimized by the pickup manufacturer. It was also assumed that with minimization of stray capacitance, the resonance peak would be considerably higher in frequency than the audio frequency band, such that the peaks would not affect the fidelity of reproduced sound within the audio range. However it now known that the aforenoted resonance peaks in the 30 kHz–40 kHz range which are often found with magnetic pickups significantly affect transient distortion and are the source of noise. Further a flat frequency response characteristic far in excess of the audio band is required for good transient reproduction. Poor transient reproduction, i.e. poor attack and decay time reproduction characteristics of magnetic pickups have been found to adversely affect the tonal quality reproduction of the sound.

The present invention is an equalizing preamplifier for use with a magnetic pickup which compensates both for the resistance portion of a pickup impedance and the stray capacitance, and at the same time establishes a transfer characteristic which can be predetermined, e.g. to match a RIAA or NAB frequency characteristic. Accordingly the effect of the pickup resonance and of the aforenoted undesirable electrical component characteristics other than those precisely desired are substantially eliminated. The result is the reproduction of sound from a record or tape via the pickup which is highly damped, has minimal or zero group delay change with frequency, has low or virtually no self-resonant characteristics, and fast transient response. Noise caused by pickup resonance is substantially eliminated, imaging is excellent and frequency response is very wide. Phase errors and distortion caused by non-linear impedance are rendered extremely low or are virtually eliminated.

The above benefits are obtained by terminating the pickup with a negative impedance, which is designed to cancel virtually all voltage developed by the inductor, and virtually eliminates the effect of the parallel stray capacitance. The series resistance within the cartridge is partially cancelled, whereby the remaining resistance with the inductance of the inductor together forms a pole at a predetermined frequency at the low frequency end or below the frequency band to be translated. This pole decreases the impedance by 20 dB/decade, with increasing frequency higher than the pole, and simultaneously the gain of the negative impedance amplifier is reduced by the same amount. A true integrated response characteristic results.

A pedestal filter translates the output signal of the negative impedance amplifier, the sloping portion of the filter transfer characteristic between the low gain low frequency portion and the higher gain, higher frequency portion increasing at about the same rate as the decrease in gain of the amplifier. The result is an RIAA transfer characteristic.

In a similar manner a NAB or other standard transfer characteristic can be obtained.

In general, the invention is an equalizing preamplifier for use with a magnetic pickup which includes an inductor comprising a negative impedance amplifier connected to the output of the pickup for cancelling virtually all voltage developed across the inductor, and means for receiving an output signal from the output of the negative impedance amplifier upon a varying magnetic field being applied to the inductor.

More particularly, the invention is an equalizing preamplifier for use with a magnetic pickup which includes an inductor, comprising a first negative impedance amplifier connected to the pickup forming an integrator for providing a pole at a frequency at the low end or below the frequency band to be translated by the amplifier, and a gain characteristic decreasing with increasing frequency, at a predetermined rate, and a pedestal filter connected to the first amplifier having a zero phase shift point at a predetermined frequency higher than the frequency of the pole and within the frequency band, the filter having an intermediate increasing gain characteristic approximately equal to the decreasing gain characteristic of the integrator, for providing an output signal upon a varying magnetic field being applied to the inductor, whereby a predetermined gain characteristic is obtained having low and high frequency response decreasing at the predetermined rate with increasing frequency, and an intermediate frequency response which is approximately constant.

A better understanding of the invention will be obtained by reference to the detailed description below in conjunction with the following drawings, in which:

FIG. 1 is a block diagram of the basic invention,

FIG. 2 is a schematic diagram of the preferred embodiment of the invention, and

FIG. 3 is a frequency response characteristic which will be used as an aid to understanding the invention.

Turning first to FIG. 1, a magnetic pickup 1 is coupled to input of a negative impedance amplifier 2. The output of the negative impedance amplifier is connected to the input of a pedestal filter 3. An output signal is obtained at output port 4. The magnetic pickup is of the type having an inductor in series with an equivalent resistance (which provides the characteristic impedance of the pickup), with a stray capacitance in parallel with the cartridge, i.e. in parallel with the series inductor and resistor. The equivalent resistance is usually constituted by the resistance of the inductor windings. The negative impedance 2 amplifier is designed to cancel virtually all voltage developed by the inductor, and to cancel part of the resistance. The result is an integrator with a pole at a frequency defined by the remaining value of the resistance and the inductance of the inductor. The frequency transfer characteristic for signals caused by a variation in the field (or caused by generating a field) in the inductor decreases at a rate of 20 dB per decade.

Additional curve shaping is provided by the pedestal filter 3, resulting in an output characteristic conforming to a predetermined shape, such as RIAA or NAB, as will be described further below.

A schematic of the preferred form of the invention is shown in FIG. 2. The magnetic pickup 1, which can be a phonograph cartridge, magnetic tape head, or the like, has an equivalent circuit comprised of an inductor L in series with a resistor $R_s$, the series circuit being bypassed by stray capacitance $C_s$. One terminal of the pickup is connected to ground in the usual manner. The other terminal is connected to a negative impedance amplifier, in particular the inverting input of an operational amplifier 5. The non-inverting and inverting inputs of amplifier 5 are connected to the output of operational amplifier 5 by individual resistors $R_F$. A capacitor $C_F$ is connected between the inverting input of the operational amplifier and its output, and the non-inverting input is connected to ground (i.e. the first terminal of the pickup) via resistor $R_{COMP}$.

The output of operational amplifier 5 is connected to the input of a pedestal filter 3, the output of which forms the output port 4 of the circuit.

The values of the components connected to the operational amplifier are selected to cancel virtually all voltage developed across the indicator L. It is desired to obtain a virtually ideal integrator within the translation band of the circuit, and therefore a pole is set at the low frequency end or below the audio band of interest. In order to obtain the ideal integration, a portion of the resistor $R_s$ is cancelled. This is obtained by setting resistor $R_{COMP}$ to the value of $R_s$ less the impedance of the inductor at the desired pole frequency.

For example to obtain an RIAA standard response, a pole should be set at about 50 Hertz. Therefore resistor $$R_{COMP} = R_s - 2\pi \times 50 \times L$$

where L is the inductance of the inductor in the pickup.

A typical high fidelity phonograph cartridge has an inductance of about 0.34 Henries, a series resistance of about 660 ohms and a stray capacitance of about 20 pF. The resistor $R_{COMP}$ should in that case have a resistance of about 550 ohms.

The value of capacitor $C_F$ is set to cancel the rising frequency response caused by the resonance of the capacitor $C_s$ and the inductor.

The result at the output of the operational amplifier is a pole at about 50 Hertz dropping at 20 dB/decade as shown by the solid line 6 (FIG. 3).

The output signal of the operational amplifier is passed through a pedestal filter 3. The frequency transfer characteristic of the pedestal filter is shown in FIG. 3 as the broken solid line 7. The zero phase point of the pedestal filter is set at 1000 Hertz, to meet the RIAA characteristic. The break point frequencies to the sloping portion of the pedestal filter transfer characteristic are selected to be about 500 Hertz and 2120 Hertz. The sloping portion increases at 6 dB per octave (20 dB per decade). The result is a highly accurate RIAA characteristic shown as the dashed line 8 in FIG. 3. The transfer characteristic decreases with increasing frequency at 20 dB per decade from 50 Hertz to 500 Hertz, has a constant or flat characteristic from 500 Hertz to 2120 Hertz, then decreases at higher frequencies, at 20 dB/decade. A prototype of this invention has displayed an RIAA characteristic accurate to within 0.02 dB of the standard.

A tape reproduction head can be coupled to the input of the negative impedance amplifier via a transformer, typically a 1:10 step up transfer. The negative impedance is reflected through the transformer. It has been found that both the low and high frequency performance of the transformer can be improved while the noise impedance is matched to the following circuitry (with an impedance as low as approximately 4 ohms). The resultant 4 ohm tape head impedance can be matched into a higher impedance through the transformer.

FIG. 2 shows a tape recorder playback head 9 coupled through a step up transformer 10, the output of the secondary of which is depicted having an arrow, which is to be connected to the inverting input of operational amplifier 5 in place of pickup 1. The primary of the transformer can be connected to a current source tape head or to a low impedance voltage source. Using the current source the good common mode performance of the transformer is utilized, while the ill effects of the transformer are reduced by several orders of magnitude.

The invention described above has been found to substantially reduce poor phase, transient and frequency response and significant noise caused by pickup resonance, and facilitates virtually perfect impedance match with following amplifiers and very high cartridge damping even with very low impedance (low output) voltage type pickups. The fidelity of output sound has been found to be substantially improved over prior art high fidelity pickups.

In prior art systems the low frequency gain is determined by the gain of the system preamplifier. Consequently low frequency noise is amplified by the maximum gain of the preamplifier. In the present invention the gain is controlled by the negative resistance and the inductance. Since a true inductor or capacitor does not produce source noise there is a total absence of flicker noise. At high frequencies the noise is also slightly lower due to the series resistance of the inductor which is reduced by the negative resistance.

The negative impedance amplifier has the effect of applying energy to the inductor cancelling the voltage thereacross. Since the effective load of the inductor is the negative value of its resistance ($R_s$), the inductor is effectively short circuited. Consequently there is no voltage developed and group delay variation with frequency is virtually eliminated. A typical phase angle error is less than 1° at 10 kHz.

The result is a more intimate and therefore faster coupling of the magnet of the pickup with the inductor (in the phonograph cartridge application) thus increasing the quality of the image.

A person skilled in the art understanding this description may now conceive of variations and other embodiments, using the principles described herein. All are considered to be within the sphere and scope of the invention as defined in the claims appended hereto.

We claim:

1. A preamplifier for use with a magnetic pickup which includes an inductor comprising:
   (a) first negative impedance means for connection to the pickup forming an integrator with the inductor, for establishing a pole at a frequency at the low end or below a frequency band to be translated by the preamplifier, and a transfer characteristic decreasing with increasing frequency at a predetermined rate, and (b) a pedestal filter connected to receive an output signal of the first means having a zero phase shift point at a predetermined frequency higher than the frequency of the pole and within said frequency band, and an intermediate frequency band transfer characteristic increasing at a rate approximately equal to the decreasing transfer characteristic of the integrator, for providing an output signal upon a varying magnetic field being applied to the inductor, whereby a predetermined gain characteristic is obtained having a low and high frequency response decreasing at said predetermined rate within increasing frequency, and an intermediate frequency response which is approximately constant.

2. A preamplifier as defined in claim 1 in which the first means is comprised of a negative resistance amplifier adapted to cancel voltage developed by the inductor, and a portion of its resistance.

3. A preamplifier as defined in claim 1 in which the magnetic pickup is comprised of an inductor with an equivalent series resistance bypassed by a parallel stray capacitance, the first means being comprised of a negative impedance formed of an operational amplifier having its inverting input connected to one terminal of the pickup, a first resistor of resistance $R_F$ connected between the inverting input and the output of the operational amplifier, a capacitor of capacitance $C_F$ connected in parallel with the first resistor, a second resistor of resistance $R_F$ connected between the non-inverting input of the operational amplifier and its output, and a third resistor of resistance $R_{COMP}$ connected between said non-inverting input and the other terminal of the pickup, in which the resistance $R_{COMP}$ is equal to the value of said equivalent series resistance less the impedance of the inductor at the frequency of said pole, and in which the value of the capacitor $C_F$ is selected to substantially cancel a frequency resonance caused by the stray capacitance.

4. A preamplifier as defined in claim 3 in which the pole is selected to be at about 50 Hz, the zero phase shift point is selected to be at about 1000 Hz, and the translation frequencies of the pedestal filter are selected to be at about 500 Hz and 2120 Hz respectively, whereby an RIAA response characteristic in the audio frequency band is obtained.

5. A preamplifier as defined in claim 1, in which the magnetic pickup is a phonograph cartridge connected to the input of the negative impedance amplifier.

6. A preamplifier as defined in claim 1, in which the magnetic pickup is a tape recorder head connected to the input of the negative impedance amplifier.

* * * * *